(12) United States Patent
Katoh et al.

(10) Patent No.: US 8,164,719 B2
(45) Date of Patent: Apr. 24, 2012

(54) LIQUID CRYSTAL DISPLAY DEVICE

(75) Inventors: Hiromi Katoh, Osaka (JP); Hiroyuki Ogawa, Osaka (JP); Christopher Brown, Oxford (GB); Benjamin James Hadwen, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 271 days.

(21) Appl. No.: 12/445,153

(22) PCT Filed: Jun. 21, 2007

(86) PCT No.: PCT/JP2007/062534
§ 371 (c)(1),
(2), (4) Date: Apr. 10, 2009

(87) PCT Pub. No.: WO2008/044371
PCT Pub. Date: Apr. 17, 2008

(65) Prior Publication Data
US 2010/0118237 A1    May 13, 2010

(30) Foreign Application Priority Data

Oct. 13, 2006    (JP) .................................. 2006-280571

(51) Int. Cl.
  *G02F 1/1333* (2006.01)
  *G02F 1/133* (2006.01)
(52) U.S. Cl. ............ 349/110; 349/116; 349/28; 349/29; 257/59
(58) Field of Classification Search ........................ None
  See application file for complete search history.

(56) References Cited

U.S. PATENT DOCUMENTS

| 5,677,211 A * | 10/1997 | Kaneko ........................ 438/158 |
| 7,164,164 B2 | 1/2007 | Nakamura et al. |
| 2003/0201450 A1 * | 10/2003 | Yamazaki et al. ............. 257/88 |
| 2005/0045881 A1 * | 3/2005 | Nakamura et al. ............. 257/59 |

FOREIGN PATENT DOCUMENTS

| JP | 60-117690 | 6/1985 |
| JP | 8-274340 | 10/1996 |
| JP | 2006-3857 | 1/2006 |

OTHER PUBLICATIONS

International Search Report for PCT/JP2007/062534, mailed Aug. 7, 2007.
T. Nakamura et al., "A Touch Panel Function Integrated LCD including LTPS A/D Converter", SISD "05", Digest, pp. 1054-1055, 2005.

* cited by examiner

*Primary Examiner* — Hemang Sanghavi
(74) *Attorney, Agent, or Firm* — Nixon & Vanderhye P.C.

(57) ABSTRACT

The present invention provides a liquid crystal display device capable of preventing the occurrence of dark currents in photodiodes. Thus, the liquid crystal display device includes a liquid crystal display panel 1 including an active matrix substrate and a backlight 13 for illuminating the liquid crystal display panel. The active matrix substrate 1 includes a photodiode 7 formed by a silicon film and a light shielding film 8 for shielding the photodiode 7 against illumination light from the backlight 13. The photodiode 7 and the light shielding film 8 are provided on a base substrate 5. The light shielding film 8 is formed by a semiconductor or an insulator. Preferably, the photodiode 7 is made of, for example, polycrystalline silicon or continuous grain silicon so as to have a characteristic that its sensitivity increases as the wavelength of light entering the photodiode becomes shorter. The light-shielding film 8 is formed by a silicon film, for example amorphous silicon, that reduces the transmittance of light entering the light shielding film as the wavelength of the light becomes shorter.

3 Claims, 7 Drawing Sheets

LIQUID CRYSTAL DISPLAY DEVICE

This application is the U.S. national phase of International Application No. PCT/JP20071062534, filed 21 Jun. 2007, which designated the U.S. and claims priority to Japanese Application No, 2006-280571, filed 13 Oct. 2006, the entire contents of each of which are hereby incorporated by reference.

TECHNICAL FIELD

The present invention relates to liquid crystal display devices including photodiodes that respond to light incident from the observer side of the display screen.

BACKGROUND ART

In recent years, liquid crystal display devices have been widely adopted as display devices of a computer, a mobile phone, a PDA and a game machine due to the characteristics such as low power consumption, thinness and light weight. Generally, liquid crystal display devices include a liquid crystal display panel and a backlight for illuminating the liquid crystal display panel from the backside. The liquid crystal display panel is formed by sandwiching a liquid crystal layer between an active matrix substrate and a counter substrate.

The active matrix substrate has a configuration in which a plurality of pixels are formed on a glass substrate in a matrix. A TFT and a pixel electrode form a pixel. The counter substrate has a configuration in which counter electrodes and color filters corresponding to respective pixels are formed on a glass substrate. Due to such a configuration, in a liquid crystal display device, a voltage applied to a space between each pixel electrode and each counter electrode is adjusted, thereby the transmittance of the liquid crystal layer is adjusted on a pixel basis. As a result, an image is displayed on a display screen due to illumination light from the backlight that passes through the liquid crystal layer.

As described above, conventional liquid crystal display devices have a function of displaying an image. However, in recent years, display devices also having a function of capturing an image have been proposed (e.g., see Patent document 1). In a liquid crystal display device disclosed in Patent document 1, a plurality of photodiodes are formed on an active matrix substrate in a matrix, and the liquid crystal display panel functions as an area sensor.

Further, in Patent document 1, a PIN diode having a lateral structure is used as each of the photodiodes. With the utilization of a TFT process, each of the PIN diodes is formed by forming a p-layer, an i-layer, and an n-layer in that order on a silicon film common to a TFT.

Structurally, these PIN diodes respond not only to light incident from the observer side but also to illumination light from the backlight. Thus, the PIN diodes are generally provided with a light shielding film on the backlight side so as to block the illumination light from the backlight from entering the PIN diodes. Due to these light shielding films, each of the PIN diodes only responds to light entered the liquid crystal display panel from the observer side, and outputs a signal.
Patent document 1: JP 2006-3857 A (pages 11 to 12 and 20 to 21, and FIGS. 20 and 38)

DISCLOSURE OF INVENTION

Problems to be Solved by the Invention

However, the light shielding films used in Patent document 1 are made of a metal material, and moreover, only a thin insulating layer is present between the light shielding film and the silicon film that forms the PIN diode. Therefore, it is difficult for a depletion layer to be formed in the i-layer. Thus, dark currents tend to occur in the PIN diodes in the liquid crystal display device of Patent document 1, thereby only low-quality captured images are obtained.

Furthermore, when the light shielding films are made of a metal material, the light shielding films may trap a charge emerged on the surface of the silicon film that forms the PIN diodes. Such phenomena lead to impairing of the correctness of output values of the PIN diodes when the PIN diodes are used continuously.

These problems become particularly noticeable when the light shielding films are formed by utilizing the gate electrodes of the TFTs. This is because the insulating layer between the light shielding film and the silicone film that forms the PIN diode becomes thinner.

The dark currents and the entrapment of charge can be prevented by increasing the distance between the light shielding film and the silicon film that forms the PIN diode. However, in this case, the area of the light shielding film needs to be increased. This may result in reduction of the aperture ratio of the liquid crystal display panel.

An object of the present invention is to provide a liquid crystal display device capable of solving the conventional problems and preventing the occurrence of dark currents in the photodiodes and variations in output values.

Means for Solving Problem

With the foregoing in mind, the liquid crystal display device of the present invention includes: a liquid crystal display panel including an active matrix substrate; and a backlight for illuminating the liquid crystal display panel. The active matrix substrate includes a photodiode formed by a silicon film and a light shielding film for shielding the photodiode against illumination light from the backlight. The shielding film is formed by a semiconductor or an insulator.

Effects of the Invention

As described above, the light shielding film for blocking illumination light in the liquid crystal display device of the present invention is formed by a semiconductor or an insulator whose resistivity is higher than that of a metal material. Thus, according to the liquid crystal display device of the present invention, the occurrence of dark currents in the photodiodes and variations in output values are prevented in comparison with the conventional liquid crystal display devices.

BRIEF DESCRIPTION OF DRAWINGS

FIG. 6 includes cross-sectional views showing main steps of manufacturing the liquid crystal display device according to the embodiment of the present invention.

FIG. 7 includes cross-sectional views showing main steps of manufacturing the liquid crystal display device according to the embodiment of the present invention.

FIG. 8 includes cross-sectional views showing main steps of manufacturing the liquid crystal display device according to the embodiment of the present invention.

DESCRIPTION OF THE INVENTION

The liquid crystal display device of the present invention includes: a liquid crystal display panel including an active matrix substrate; and a backlight for illuminating the liquid crystal display panel. The active matrix substrate includes a photodiode formed by a silicon film and a light shielding film for shielding the photodiode against illumination light from the backlight. The shielding film is formed by a semiconductor or an insulator.

In the liquid crystal display device of the present invention, it is preferable that the photodiode has a characteristic that its sensitivity increases as the wavelength of light entering the photodiode becomes shorter, and the light shielding film is formed by a silicon film with a characteristic that reduces the transmittance of light entering the light shielding film as the wavelength of the incident light becomes shorter In this case, it is possible to prevent the photodiode from reacting to illumination light from the backlight with certainty. Specifically, the silicon film that forms the photodiode is made of polycrystalline silicon or continuous grain silicon, and the light shielding film is made of amorphous silicon.

In the liquid crystal display device of the present invention, the active matrix substrate may include a plurality of active elements disposed in a matrix, and a plurality of the photodiodes may be provided in a matrix. Furthermore, the photodiode may include a first conductivity type semiconductor region, an intrinsic semiconductor region, and a second conductivity type semiconductor region opposite to the first conductivity type, and the first conductivity type semiconductor region, the intrinsic semiconductor region, and the second conductivity type semiconductor region may be disposed in this order in the plane direction of the silicon film that forms the photodiode.

Embodiment

Figure 1:
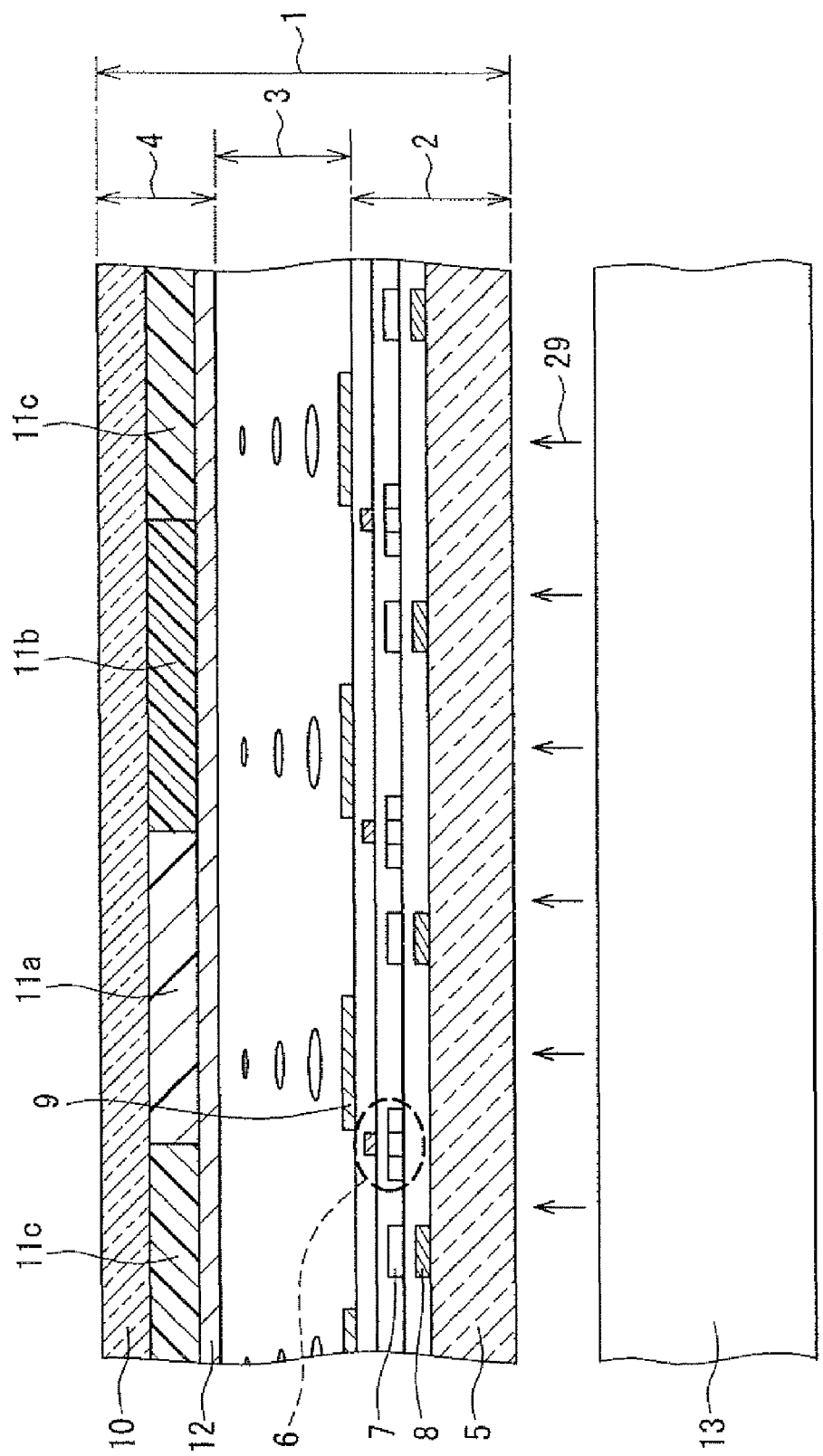
FIG. 1 is a cross-sectional view schematically showing an entire configuration of a liquid crystal display device according to the embodiment of the present invention.
Figure 2:
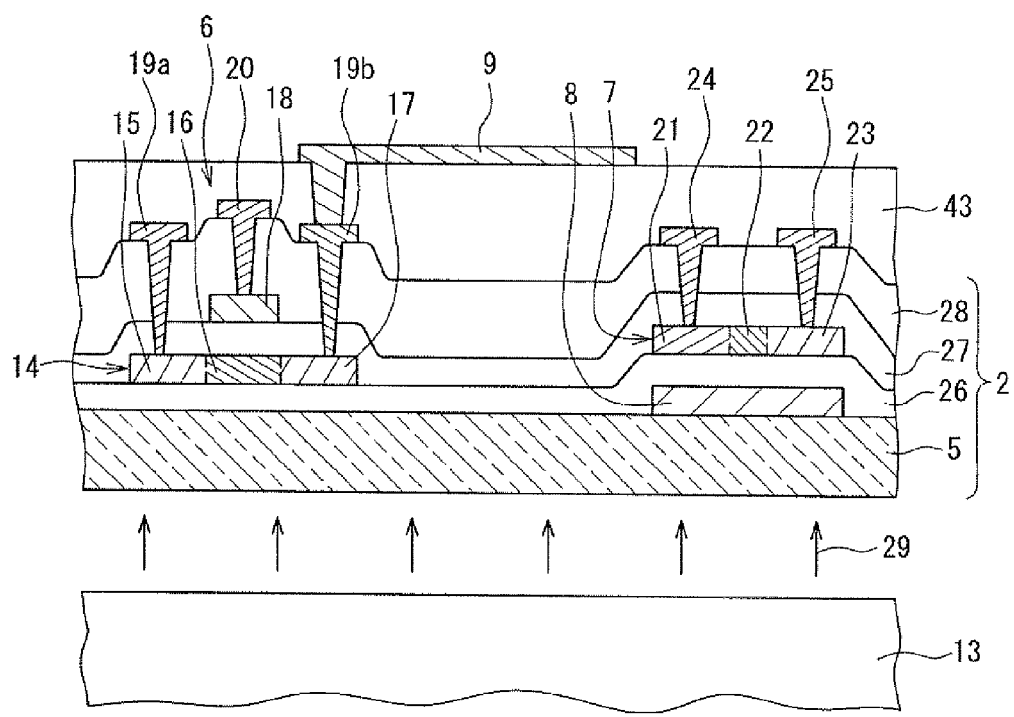
FIG. 2 is a cross-sectional view showing a part of an active matrix substrate of the liquid crystal display device shown in FIG. 1 in an enlarged state.

Hereinafter, a liquid crystal display device according to the embodiment of the present invention will be described with reference to FIGS. 1 to 8. First, the configuration of the liquid crystal display device according to the present embodiment will be described with reference to FIGS. 1 to 5. FIG. 1 is a cross-sectional view schematically showing the entire configuration of the liquid crystal display device according to the embodiment of the present invention. FIG. 2 is a cross-sectional view showing a part of an active matrix substrate of the liquid crystal display device shown in FIG. 1 in an enlarged state. In FIGS. 1 and 2, hatching is omitted for an insulating material.

As shown in FIG. 1, similarly to the conventional liquid crystal display device (prior art) described in the Background. Art section, the liquid crystal display device according to the present embodiment includes a liquid crystal display panel 1 and a backlight 13 for illuminating the liquid crystal panel 1. The liquid crystal display panel 1 includes an active matrix substrate 2, a liquid crystal layer 3, and a filter substrate 4. The liquid crystal layer 3 is sandwiched between the active matrix substrate 2 and the filer substrate 4.

As shown in FIG. 1, the active matrix substrate 2 includes a plurality of active elements 6 and pixel electrodes 9 disposed in a matrix on a glass substrate 5 as a base substrate. A pair of the active element 6 and the pixel electrode 9 form a single pixel. In the present embodiment, the active elements 6 are thin film transistors (TFTs). In the following description, the active elements will be referred to as TFTs 6.

The filter substrate 4 includes a glass substrate 10 as a base substrate on which color filters and a counter electrode 12 are provided. Each of the color filters is composed of a red (R) colored area 11a, a green (G) colored area 11b, and a blue (B) colored area 11c that correspond to either of the pixels.

As shown in FIG. 2, each of the TFTs 6 includes a silicon film 14 and a gate electrode 18. The silicon film 14 is formed on a first interlayer insulating film 26 covering the top surface of the glass substrate 5. The gate electrode 18 is formed on a second interlayer insulating film 27 covering the silicon film 14. The portion where the second interlayer insulating film 27 and the gate electrode 18 overlap functions as a gate insulating film. Further, the gate electrode 18 is covered with a third interlayer insulating film 28. In the present embodiment, the silicon film 14 is made of continuous grain silicon (CGS), which is excellent in terms of a charge transfer rate.

In the silicon film 14, an n-type diffusion layer to be a source region 15 and an n-type diffusion layer to be a drain region 17 are formed. A region of the silicon film 14 directly underneath the gate electrode 18, i.e., the region between the source region 15 and the drain region 17 becomes a channel region 16. Furthermore, a source line 19a that passes through the second interlayer insulating film 27 and the third interlayer insulating film 28 is connected to the source region 15, and a drain line 19b that passes through the second interlayer insulating film 27 and the third interlayer insulating film 28 is connected to the drain region 17. A gate line 20 that passes through the third interlayer insulating film 28 is connected to the gate electrode 18.

Moreover, an insulating protective film 43 is formed to cover the third interlayer insulating film 28, the source line 19a, the drain line 19b, and the gate line 20. The pixel electrode 9 made of ITO or the like is formed on the top layer of the protective film 43. In the present embodiment, the pixel electrode 9 is connected electrically to the drain line 19b through a conductive path that passes through the protective film 43.

Further, as shown in FIGS. 1 and 2, similarly to the conventional example, the active matrix substrate 2 also in the present embodiment includes photodiodes 7 and light shielding films 8 for shielding the photodiodes 7 against illumination light 29 from the backlight 13. A plurality of the photodiodes 7 and the light shielding films 8 are provided in a matrix. In the present embodiment, each of the photodiodes 7 and the light shielding films 8 is provided in every pixel or plurality of pixels. An area sensor is composed of a plurality of the photodiodes 7.

Further, as shown in FIG. 2, each of the photodiodes 7 is formed by the silicon film formed on the first interlayer insulating film 26. Also in the present embodiment, the photodiodes 7 are PIN diodes having a lateral structure, and they include a p-type semiconductor region (p-layer) 21, an intrinsic semiconductor region (i-layer) 22, and an n-type semiconductor region (n-layer) 23 disposed in that order in the plane direction.

In the present embodiment, the i-layer 22 only needs to be a region that is electrically neutral than the adjacent p-layer 21 and n-layer 22. It is preferable that the i-layer 22 is a region that is completely free of impurities and/or a region where the conduction electron density and the hole density are equal to each other. In FIG. 2, reference numeral 24 denotes a wiring connected to the p-layer 21, and 25 denotes a wiring connected to the n-layer 22. The wirings 24 and 25 are also covered with the protective film 43.

As described above, the liquid crystal display device according to the present embodiment has a configuration similar to that of the conventional example. However, the liquid crystal display device according to the present embodiment is different from the conventional example in that the light shielding films 8 are formed by a semiconductor or an insulator.

Here, a semiconductor is referred to a material whose resistivity is in a range of $10^{-6}$ [Ω·m] and $10^7$ [Ω·m]. Such semiconductors include elemental semiconductors, such as silicon (Si) and germanium (Ge), compound semiconductors, such as GaAs and GaP, metal-oxide semiconductors, such as $SiO_2$ and ZnO and the like. An insulator is referred to a material whose resistivity is larger than $10^7$ [Ω·m]. Such insulators include rubber, resins, glass and the like.

In the present embodiment, the light shielding films 8 are formed by a semiconductor or an insulator. Thus, a depletion layer is more likely to be formed in the i-layer 22 of the photodiodes 7 than in the conventional example. Therefore, the occurrence of dark currents in the photodiodes 7 is prevented, thereby the quality of a captured image that is obtained by a plurality of the photodiodes 7 can be improved.

In the present invention, there is no limitation to the light shielding films 8 as long as they are formed by the semiconductor or the insulator as described above. However, in the present embodiment, it is preferable that the light shielding films 8 are made of amorphous silicon. This is because the silicon film 14 that forms the respective TFTs 6 is made of continuous grain silicon. In this regard, a description will be given with reference to FIGS. 3 to 5.

Figure 3:
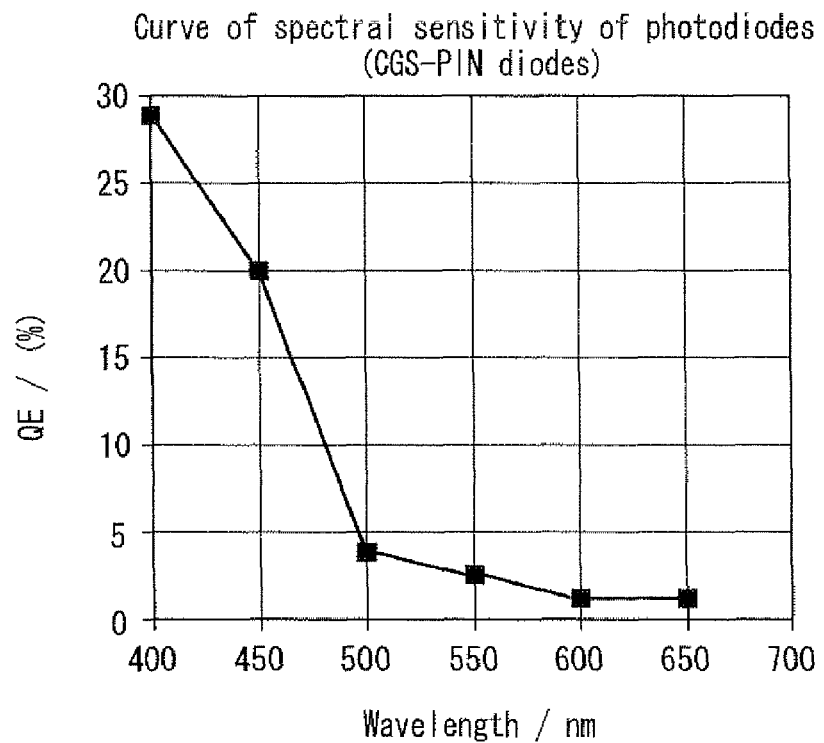
FIG. 3 is a graph showing the spectral sensitivity of the photodiodes shown in FIGS. 1 and 2.
Figure 4:
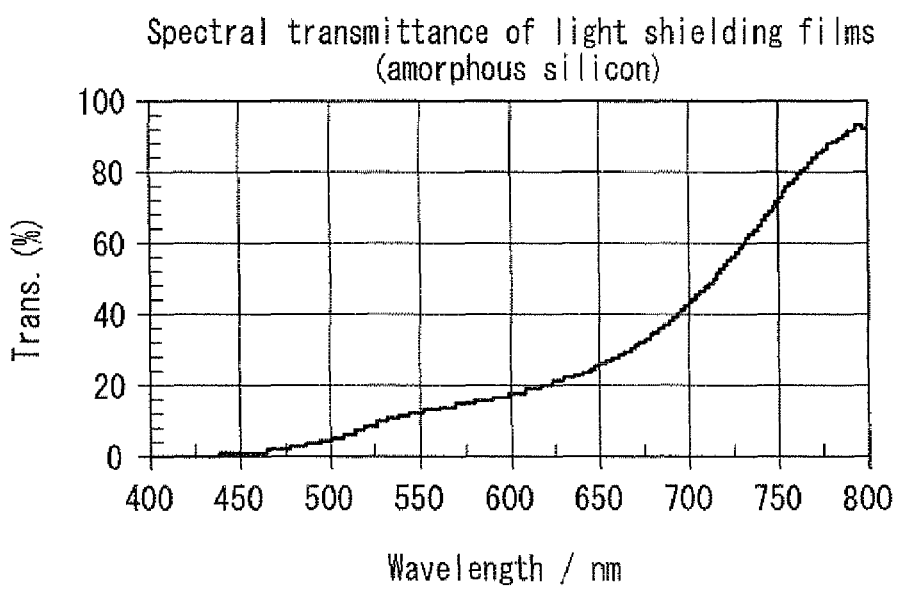
FIG. 4 is a graph showing the spectral transmittance of the light shielding films shown in FIGS. 1 and 2.
Figure 5:
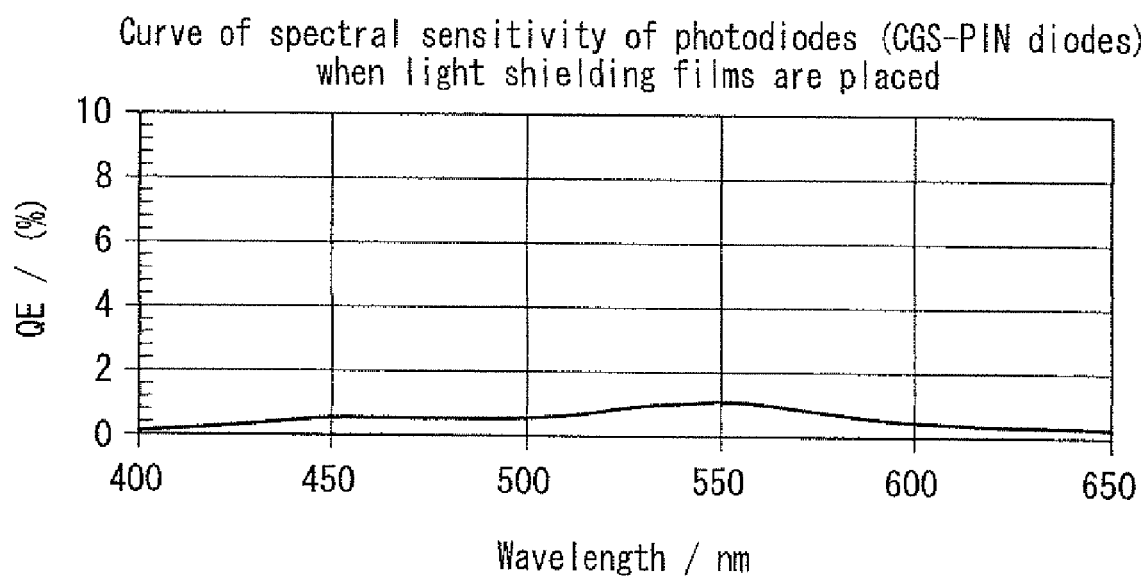
FIG. 5 is a graph showing the spectral sensitivity of the photodiodes when the light shielding films are disposed.

FIG. 3 is a graph showing the spectral sensitivity of the photodiodes shown in FIGS. 1 and 2. FIG. 4 is a graph showing the spectral transmittance of the light shielding films shown in FIGS. 1 and 2. FIG. 5 is a graph showing the spectral sensitivity of the photodiodes when the light shielding films are disposed.

As shown in FIG. 3, the photodiodes 7 made of continuous gain silicon have a characteristic that the sensitivity increases as the wavelength of light entering the photodiodes 7 becomes shorter. That is, the photodiodes 7 tend to react to blue light having a short wavelength but tend not to react to red light having a long wavelength.

In contrast, as shown in FIG. 4, the light shielding films 8 made of amorphous silicon have a characteristic that reduces the transmittance of light entering the light shielding film 8 as the wavelength of the light becomes shorter. That is, the light shielding film 8 tend not to let blue light having a short wavelength pass through themselves, but tend to let red light having a long wavelength pass through themselves.

Therefore, when the light shielding films 8 are disposed between the photodiodes 7 and the backlight 13, the light shielding films 8 block most of the blue components contained in the illumination light 29 (see FIGS. 1 and 2) from the backlight 13. Thus, the blue components are less likely to enter the photodiodes 7. Though the red components contained in the illumination light 29 pass through the light shielding films 8, the photodiodes 7 hardly react to the red components as shown in FIG. 3.

Therefore, when the light shielding films 8 are disposed, the spectral sensitivity of the photodiodes 7 with respect to the illumination light 29 becomes as shown in FIG. 5. Accordingly, due to the light shielding films 8, the photodiodes 7 hardly react to the illumination light 29 from the backlight 13, and only detect ambient light that enters the liquid crystal display panel 1 from the observer side.

Further, due to the characteristics shown in FIGS. 3 to 5, the photodiodes 7 are observed as red objects when seen from the observer side. Therefore, it is preferable that the photodiodes 7 are disposed to overlap the red areas of color filters in the thickness direction of the liquid crystal display panel 1. When the photodiodes 7 are disposed in this way, it becomes difficult for an observer to recognize the presence of the photodiodes 7. Thus, the display quality of the liquid crystal display device can be improved.

Figure 7A:
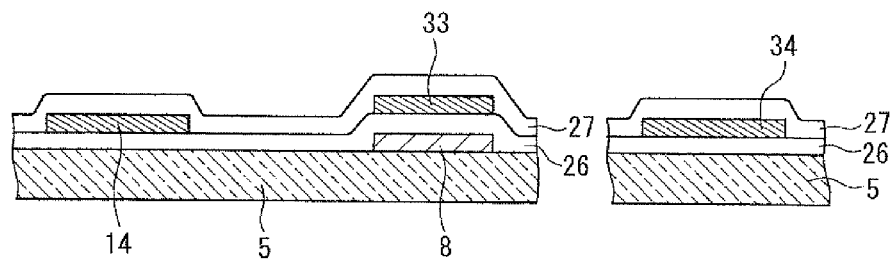
FIGS. 7A to 7C show a series of main steps of manufacturing the active matrix substrate that are performed after the step shown in FIG. 6D.
Figure 7B:
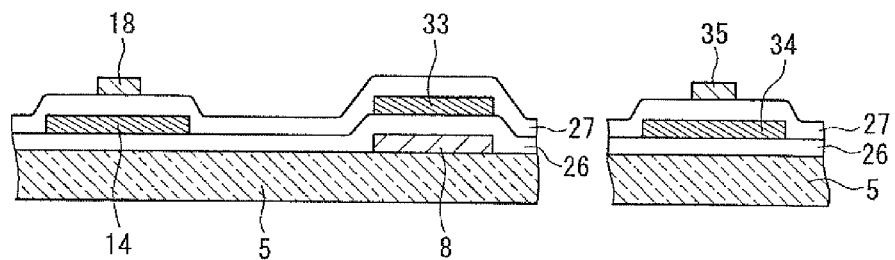
Figure 7C:
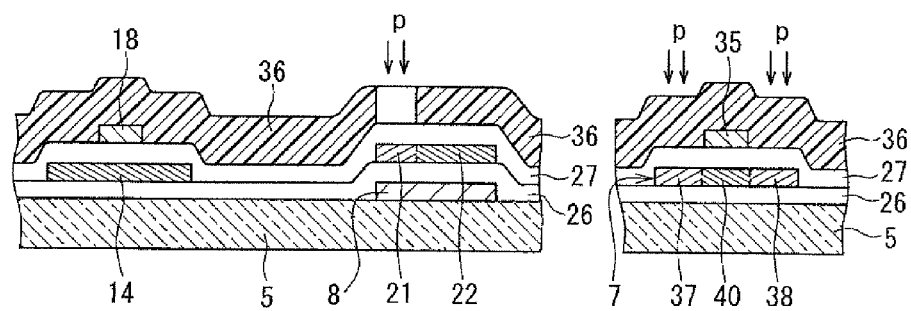
Figure 8A:
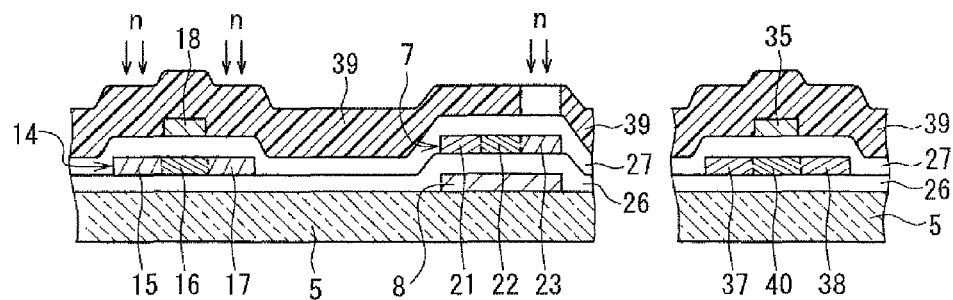
FIGS. 8A to 8C show a series of main steps of manufacturing the active matrix substrate that are performed after the step shown in FIG. 7C.
Figure 8B:
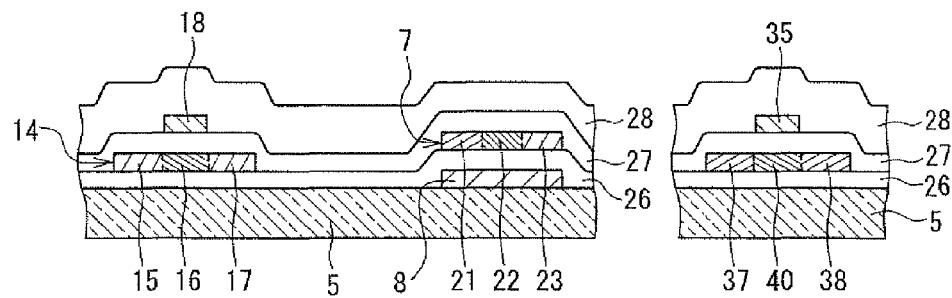
Figure 8C:
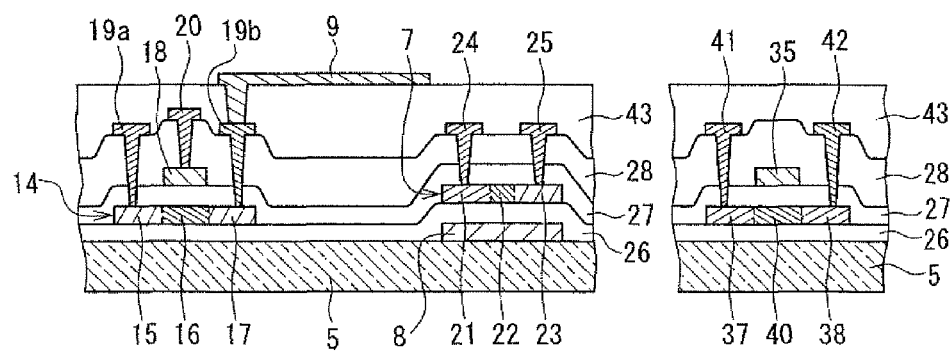

Next, steps of manufacturing the liquid crystal display device according to the present embodiment will be described with reference to FIGS. 6 to 8. FIGS. 6 to 8 include cross-sectional views showing main steps of manufacturing the liquid crystal display device according to the embodiment of the present invention. FIGS. 6A to 6D show a series of main steps of manufacturing the active matrix substrate in the initial stage. FIGS. 7A to 7C show a series of main steps of manufacturing the active matrix substrate performed after the step shown in FIG. 6D. FIGS. 8A to 8C show a series of main steps of manufacturing the active matrix substrate performed after the step shown in FIG. 7C.

In addition to the steps of manufacturing the TFTs and the photodiodes that form pixels, FIGS. 6 to 8 also show steps of manufacturing TFTs that form a peripheral circuit. In FIGS. 6 to 8, hatching is omitted for an insulating material.

Figure 6A:
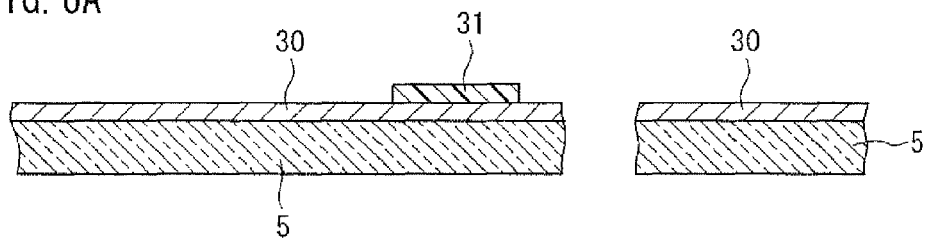
FIGS. 6A to 6D show a series of main steps of manufacturing the active matrix substrate in the initial stage.

As shown in FIG. 6A, first, a silicon film 30 as the light shielding film 8 is formed on one surface of the glass substrate 5 as the base substrate of the active matrix substrate (see FIGS. 1 and 2) by a chemical vapor deposition (CVD) method, spattering or the like. As described above, the silicon film 30 is made of amorphous silicon. The film thickness of the silicon film 30 is preferably, for example, 50 nm or more. In the example shown in FIGS. 6 to 8, the film thickness is set to 200 nm. Next, as shown in FIG. 6A, a resist pattern 31 is formed by photolithography on the silicon film 30 at the portion that overlaps with the region for forming the light shielding film 8.

Figure 6B:
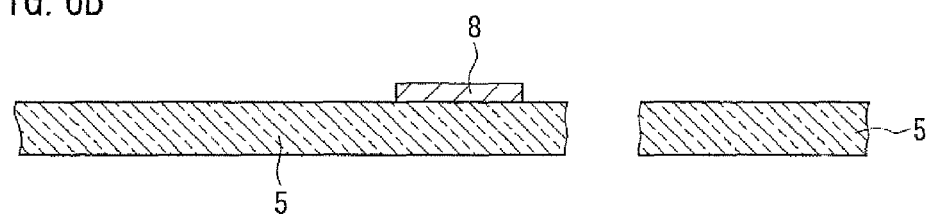
Figure 6C:
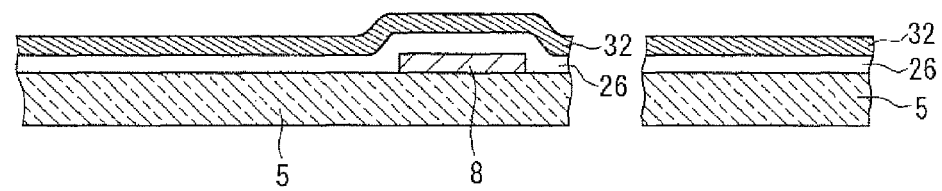
Figure 6D:
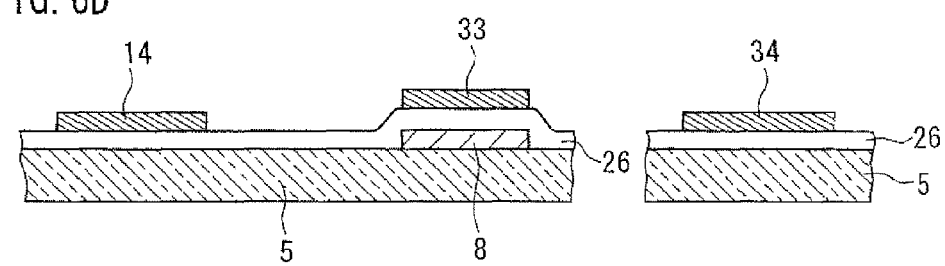

Then, as shown in FIG. 6B, by using the resist pattern 31 as a mask, the amorphous silicon film 30 is subjected to etching to obtain the light shielding film 8. Subsequently, as shown in FIG. 6C, the first interlayer insulating film 26 is formed to cover the light shielding film 8. The first interlayer insulating film 26 can be obtained by forming a silicon oxide film or a silicon nitride film with a CVD method, for example. The interlayer insulating film 26 may be a single layer film or a multilayer film. The thickness is set in a range of 100 nm to 500 nm, for example.

Further, as shown in FIG. 6C, a silicon film 32, which is to become the TFTs and the photodiodes, is formed on the first interlayer insulting film 26 by a CVD method or the like. As described above, the silicon film 32 is made of continuous grain silicon. Specifically, the silicon film 32 is formed through the following steps.

First, a silicon oxide film and an amorphous silicon film are formed on the first interlayer insulating film 26 in that order. Next, a nickel thin film to serve as a catalysis for accelerating crystallization is formed on the surface layer of the amorphous silicon film. Then, the nickel thin film and the amorphous silicon film are reacted to each other by laser annealing so as to form a crystal silicon layer on the interface. Subsequently, unreacted portions of the nickel film and a nickel silicide layer are removed by etching or the like. Next, the remaining silicon film is laser annealed to advance the crystallization, thereby the silicon film 32 made of continuous grain silicon is obtained.

Next, resist patterns (not shown) are formed on the silicon film 32 at the portions that overlap with the regions for forming the TFTs (the TFTs for the both pixels and peripheral circuit) and the photodiodes. By using these resist patterns as masks, the silicon film 32 is subjected to etching. As a result, a silicon film 14 that forms the TFT 6 for driving a pixel (see FIGS. 1 and 2), a silicon film 33 that forms the photodiode, and a silicon film 34 that forms the TFT for a peripheral circuit are obtained.

Next, as shown in FIG. 7A, the second interlayer insulating film 27 is formed to cover the silicon films 14, 33 and 34. The second interlayer insulating film 27 functions also as a gate insulating film of the TFTs.

Similarly to the first interlayer insulating film 26, the second interlayer insulating film 27 is obtained by forming a silicon oxide film or a silicon nitride film with a CVD method. Specifically, in the case of forming a silicon oxide film, the film can be formed by performing a plasma CVD method, using $SiH_4$ and $N_2O$ (or $O_2$) as raw material gas. Further, similarly to the first interlayer insulating film 26, the second interlayer insulating film 27 may be a single layer film or a multilayer film. The thickness of the second interlayer insulating film 27 is set in a range of 10 nm to 120 nm, for example.

Subsequently, as shown in FIG. 7B, a gate electrode 18 for the TFT 6 for driving a pixel and a gate electrode 35 for the TFT for a peripheral circuit are formed. Specifically, first a conductive layer is formed by performing sputtering or vacuum evaporation, using a metal material whose principal ingredient is an element such as Ta, Ti, W, Mo or Al. For example, in the present embodiment, a conductive layer of a W/TaN alloy is formed. Next, resist patterns are formed on the conductive layer at the portions that overlap with the regions for forming the gate electrodes by photolithography. By subjecting the conductive layer to etching and using the resist patterns as masks, the gate electrodes 18 and 35 are formed.

Next, as shown in FIG. 7C, ion implantation for forming a p-type diffusion layer is performed. In the present embodiment, a p-type diffusion layer is formed in the photodiodes 7 (see FIGS. 1 and 2) and the TFTs for a peripheral circuit. Specifically, as shown in FIG. 7C, first, a resist pattern 36 is formed. The resist pattern 36 includes openings at the portions overlapping the regions for forming the p-layer 21 (see FIG. 2) of the photodiode 7 and the source region 37 and the drain region 38 of the TFT for a peripheral circuit. Reference numeral 40 denotes a channel region of the TFT for a peripheral circuit.

Subsequently, the ion implantation is performed by using p-type impurities such as boron (B) and indium (In) and setting the implantation energy in a range of 10 [KeV] to 80 [KeV] and the dose in a range of $5\times10^{14}$ [ion] to $2\times10^{16}$ [ion], for example. At this time, it is preferable that the concentration of the impurities after the implantation to be in a range of $1.5\times10^{20}$ to $3\times10^{21}$ [ions/cm$^3$]. After the ion implantation, the resist pattern 36 is removed.

Next, as shown in FIG. 8A, ion implantation for forming an n-type diffusion layer is performed. In the present embodiment, an n-type diffusion layer is formed in the photodiodes 7 and the TFTs 6 for driving pixels. Specifically, as shown in FIG. 8A, first, a resist pattern 39 is formed. The resist pattern 39 includes openings at the portions overlapping the regions for forming the n-layer 23 (see FIG. 2) of the photodiode 7 and the source region 15 and the drain region 17 of the TFT 6 for driving a pixel.

Subsequently, the ion implantation is performed by using n-type impurities such as phosphorus (P) and arsenic (As) and setting the implantation energy in a range of 10 [KeV] to 100 [KeV] and the dose in a range of $5\times10^{14}$ [ion] to $1\times10^{16}$ [ion], for example. Also at this time, it is preferable that the concentration of the impurities after the implantation to be in a range of $1.5\times10^{20}$ to $3\times10^{21}$ [ions/cm$^3$]. After the ion implantation, the resist pattern 39 is removed.

Though it is not shown, ion implantation can be performed on the i-layer 22 of the photodiodes 7 in the present embodiment. The ion implantation is performed so that the i-layer 22 becomes more electrically neutral than the p-layer 21 and the n-layer 23. Further, ions may be implanted into the i-layer 22 by utilizing either of the ion implementation steps shown in FIG. 7C and FIG. 8A or by performing separate ion implantation.

Furthermore, in the present embodiment, a heat treatment is performed after the ion implantation so as to activate the impurities. For example, the heat treatment in this case can be performed by using a method such as furnace annealing, laser annealing or rapid thermal annealing. Specifically, in the case of performing the heat treatment by furnace annealing, the heat treatment is performed in a nitrogen atmosphere by setting the temperature in a range of 300 to 650° C., preferably to 550° C. and the treatment time to about four hours.

Next, as shown in FIG. 8B, the third interlayer insulating film 28 is formed to cover the second interlayer insulating film 27 and the gate electrodes 18 and 35. Similarly to the first interlayer insulating film 26, the third interlayer insulating film 28 can also be obtained by forming a silicon oxide film or a silicon nitride film with a CVD method. Further, similarly to the first interlayer insulating film 26, the third interlayer insulating film 28 may also be a single layer film or a multilayer film. The thickness of the third interlayer insulating film 28 is set, for example, in a range of 200 nm to 2000 nm, preferably to 1 μm.

Next, as shown in FIG. 8C, after forming contact holes that pass through the second interlayer insulating film 27 and the third interlayer insulating film 28 (or only the third interlayer insulating film 28), the source line 19a, the drain line 19b and the gate line 20 that are to be connected to the TFT 6 for driving a pixel are formed. At the same time, the wirings 24 and 25 to be connected to the photodiode 7, and wirings 41 and 42 to be connected to the TFT for a peripheral circuit are also formed.

After filling the contact holes with a conductive material, each of the wirings is formed by forming a conductive film on the third interlayer insulating film 28, forming a resist pattern, and subjecting the conducting film to etching. In the present embodiment, a laminate film obtained by forming a Ti film (200 nm in thickness), an aluminum film (600 nm in thickness) containing Ti, and a Ti film (100 nm in thickness) in that order with sputtering is used as the conductive film for the wirings.

Then, the protective film 43 is formed to cover the source line 19a, the drain line 19b, the gate line 20, the wirings 24, 25, 41, and 42, and further the third interlayer insulating film 28. The protective film 43 can be obtained by forming an organic film with a coating method or the like. Further, the protective film 43 may also be a single layer film or a multilayer film. The thickness of the protective film is set in a range of 1 μm to 5 μm, preferably in a range of 2 μm to 3 μm.

After forming a contact hole that passes through the protective sheet 43, the pixel electrode 9 is formed. The pixel electrode 9 is formed by forming an ITO film with a CVD method, forming a resist pattern, and subjecting the ITO film to etching.

As described above, in the present embodiment, the TFTs 6 for driving pixels, the TFTs for a peripheral circuit, and the photodiodes 7 are all made of continuous grain silicon. However, the material is not limited to continuous grain silicon. Since polycrystalline silicon also has properties similar to those of continuous grain silicon as shown in FIG. 3, the TFTs 6 for driving pixels, the TFTs for a peripheral circuit, and the photodiodes 7 can be made of polycrystalline silicon in the present embodiment.

In the case of using polycrystalline silicon, the silicon film 32 made of polycrystalline silicon is formed in the step shown in FIG. 6C. For example, the silicon film 32 made of polycrystalline silicon can be formed as follows. First, a film of amorphous silicon is formed. Subsequently, the film of amorphous silicon is dehydrated by heating the film at 500° C. for 2 hours, for example. Then, annealing is performed to crystallize the film. Annealing methods include well-known laser annealing. Specifically, an amorphous silicon film may be irradiated with laser beam by an excimer laser.

INDUSTRIAL APPLICABILITY

As described above, according to the liquid crystal display device of the present invention, the occurrence of dark currents in the photodiodes can be prevented, and the image quality of the liquid crystal display device having an imaging function can be improved. Therefore, the liquid crystal display device of the present invention has industrial applicability.

The invention claimed is:
1. A liquid crystal display device comprising:
a liquid crystal display panel including an active matrix substrate and a backlight for illuminating the liquid crystal display panel,
wherein the active matrix substrate includes: a photodiode comprised of a silicon film; a base substrate supporting the photodiode; and a light shielding film for shielding the photodiode against illumination light from the backlight,
the shielding film comprises a semiconductor,
wherein the shielding film is located between at least the photodiode and the base substrate;
wherein the photodiode is configured so that the silicon film thereof is comprised of polycrystalline silicon or continuous grain silicon so that a sensitivity of the photodiode increases as a wavelength of incident light entering the photodiode decreases; and
wherein the light shielding film is comprised of an amorphous silicon film so that a transmittance of incident light entering the light shielding film decreases as a wavelength of the incident light decreases.
2. The liquid crystal display device according to claim 1, wherein the active matrix substrate includes a plurality of active elements disposed in a matrix, and
a plurality of the photodiodes are provided in a matrix.
3. The liquid crystal display device according to claim 1, wherein the photodiode includes a first conductivity type semiconductor region, an intrinsic semiconductor region, and a second conductivity type semiconductor region opposite to the first conductivity type, and
the first conductivity type semiconductor region, the intrinsic semiconductor region, and the second conductivity type semiconductor region are disposed in this order in a plane direction of the silicon film that forms the photodiode.

* * * * *